United States Patent
Kondoh (10) Patent No.: US 9,455,166 B2
(45) Date of Patent: Sep. 27, 2016

(54) SUBSTRATE TRANSPORTING APPARATUS, SUBSTRATE DELIVERY POSITION CONFIRMING METHOD, AND SUBSTRATE PROCESSING SYSTEM

(71) Applicant: Tokyo Electron Limited, Tokyo (JP)

(72) Inventor: Keisuke Kondoh, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 325 days.

(21) Appl. No.: 14/178,432

(22) Filed: Feb. 12, 2014

(65) Prior Publication Data
US 2014/0241836 A1 Aug. 28, 2014

(30) Foreign Application Priority Data
Feb. 27, 2013 (JP) .................................. 2013-037140

(51) Int. Cl.
*H01L 21/68* (2006.01)
*H01L 21/67* (2006.01)
*H01L 21/677* (2006.01)

(52) U.S. Cl.
CPC ... *H01L 21/67259* (2013.01); *H01L 21/67288* (2013.01); *H01L 21/67778* (2013.01)

(58) Field of Classification Search
CPC ................. H01L 21/67259; H01L 21/67778; H01L 21/67288
See application file for complete search history.

(56) References Cited

U.S. PATENT DOCUMENTS

| | | | | |
|---|---|---|---|---|
| 4,702,606 A * | 10/1987 | Matsuura | ............. | G03F 9/7049 257/797 |
| 6,198,527 B1 * | 3/2001 | Nishi | ..................... | G03B 27/52 355/53 |
| 6,298,282 B1 * | 10/2001 | Guldi | .................... | B25J 9/1674 340/3.3 |
| 7,677,859 B2 * | 3/2010 | Gilchrist | ........... | H01L 21/67772 414/217 |
| 7,742,836 B2 * | 6/2010 | Masuya | ............. | G05B 19/4061 700/16 |
| 2006/0215347 A1 * | 9/2006 | Wakabayashi | .... | H01L 21/67167 361/234 |
| 2007/0238062 A1 * | 10/2007 | Asari | .................. | F27B 17/0025 432/253 |
| 2009/0182454 A1 * | 7/2009 | Donoso | .................. | B25J 9/1692 700/254 |
| 2011/0109889 A1 * | 5/2011 | Van De Vin | ........... | G03B 27/58 355/55 |

FOREIGN PATENT DOCUMENTS

| | | | |
|---|---|---|---|
| JP | 06263219 A | * | 9/1994 |
| JP | 2000-127069 A | | 5/2000 |

* cited by examiner

*Primary Examiner* — Scott Lowe
(74) *Attorney, Agent, or Firm* — Abelman, Frayne & Schwab (57) ABSTRACT

A loader module of a substrate processing system includes a transportation arm configured to move towards a wafer accommodated in a carrier and receive the wafer, and a control unit configured to confirm a delivery position of the wafer based on an upward movement amount of an end effector of the transportation arm, and a contact sound generated when the end effector comes in contact with the wafer. The control unit confirms the delivery position of the wafer based on an average height of the end effector when the contact sound of each pad of the end effector comes in contact with the wafer to generate a contact sound a plurality of times.

15 Claims, 10 Drawing Sheets

SUBSTRATE TRANSPORTING APPARATUS, SUBSTRATE DELIVERY POSITION CONFIRMING METHOD, AND SUBSTRATE PROCESSING SYSTEM

CROSS-REFERENCE TO RELATED APPLICATIONS

This application is based on and claims priority from Japanese Patent Application No. 2013-037140, filed on Feb. 27, 2013 with the Japan Patent Office, the disclosure of which is incorporated herein in its entirety by reference.

TECHNICAL FIELD

The present disclosure relates to a substrate transporting apparatus, a method for confirming a delivery position of a substrate and a substrate processing system, in which the delivery position of the substrate is confirmed.

BACKGROUND

A substrate processing system includes a plurality of processing chambers, takes out a semiconductor wafer (hereinafter, simply referred to as a "wafer") from a container such as, for example, a multi-application carrier (MAC) accommodating a plurality of wafers having a diameter of, for example, 450 mm, carries the wafer taken out from the container into each processing chamber, and performs various processings on the wafer in the processing chamber.

The wafer is taken out from the MAC by a transportation arm which can enter into the MAC. However, in order to deliver the wafer to the transportation arm smoothly, it is required to confirm a position of each wafer in the MAC (hereinafter, referred to as a "delivery position") in advance.

Figure 9:
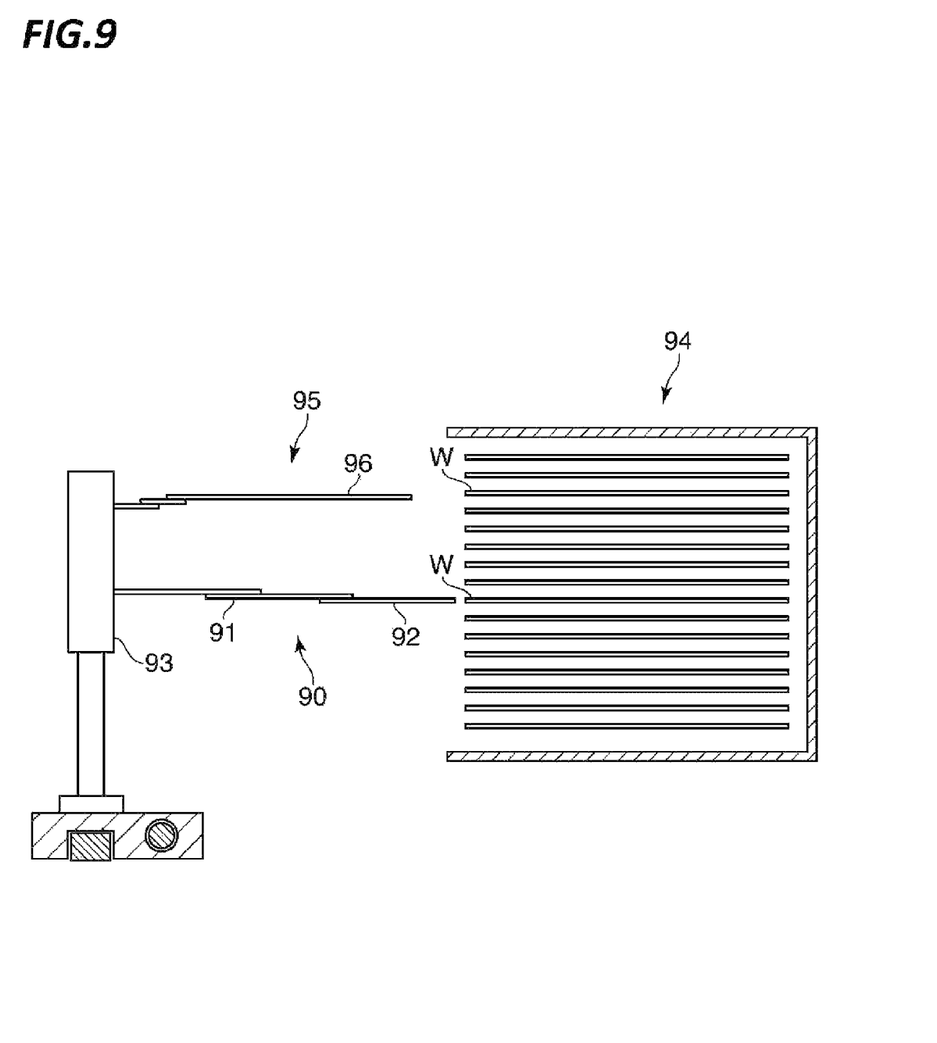
FIG. 9 is a schematic side view illustrating a configuration of a mapping arm in the related art.

A mapping arm is used to confirm a position of each wafer in the MAC. As illustrated in FIG. 9, a mapping arm 90 is provided with an expandable/retractable arm portion 91 and an optical sensor 92 installed at the tip of the arm portion 91. The mapping arm 90 is installed in a base 93 which can rotate and move up and down in opposition to a MAC 94 which is opened by removing a cover.

When confirming the position of each of the wafers W, the mapping arm 90 moves up/down and expands/retracts the arm portion 91 such that the sensor 92 is allowed to face each periphery of the wafers W, and confirms the position of the periphery as a position of the wafer W by the sensor 92. See, e.g., FIGS. 3 and 4 of Japanese Patent Laid-Open No. 2000-127069.

Further, an expandable/retractable transportation arm 95 is installed in the base 93. The transportation arm 95 enters into the MAC 94 on the basis of the confirmed position of the periphery of the wafer W, loads a portion near the center of the wafer W on a bifurcated plate-shaped end effector 96 installed at the tip, and then retreats from the inside of the MAC 94.

SUMMARY

The present disclosure provides a substrate transporting apparatus including a receiving device configured to move towards a substrate accommodated in a carrier and receive the substrate; and a confirmation device configured to confirm a delivery position of the substrate based on a movement amount of the receiving device and a contact sound generated when the receiving device comes in contact with the substrate.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

In the following detailed description, reference is made to the accompanying drawing, which form a part hereof. The illustrative embodiments described in the detailed description, drawing, and claims are not meant to be limiting. Other embodiments may be utilized, and other changes may be made, without departing from the spirit or scope of the subject matter presented here.

Figure 10:
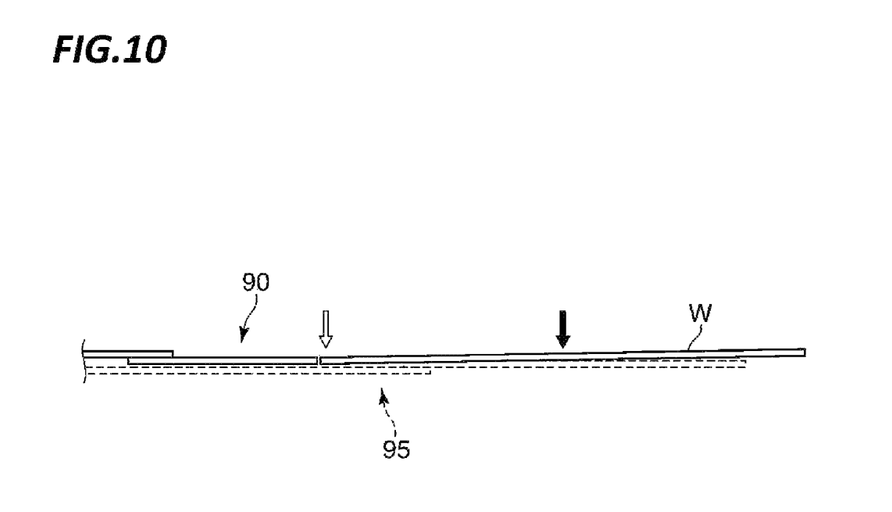
FIG. 10 is a side view illustrating a positional relationship of a wafer accommodated in an inclined state with a mapping arm and a transportation arm.

As illustrated in FIG. 10, the wafer W may be accommodated in the MAC 94 in an inclined state. In this case, the height at a position of the periphery of the wafer W (indicated by a white arrow in the figure) is different from the height at a position near the center of the wafer W which is a delivery position of the wafer W (indicated by a black arrow in the figure). That is, the position of the wafer W confirmed by the mapping arm 90 may be different from the delivery position of the wafer W.

In addition, the position of the mapping arm 90 itself may not be adjusted correctly, and the height at a position of the wafer W confirmed by the mapping arm 90 may be different from the height at the actual position of the wafer W.

As a result, there is a concern that the transportation arm 95 cannot take out each wafer W smoothly, as well as that the transportation arm 95 may interfere with each wafer W in the MAC 94.

An object of the present disclosure is to provide a substrate transporting apparatus, a method for confirming a delivery position of a substrate and a substrate processing system, in which the delivery position of the substrate can be confirmed correctly.

In order to achieve the above-mentioned object, the present disclosure provides a substrate transporting apparatus including a receiving device configured to move towards a substrate accommodated in a carrier and receive the substrate; and a confirmation device configured to confirm a delivery position of the substrate based on a movement amount of the receiving device and a contact sound generated when the receiving device comes in contact with the substrate.

In the above-mentioned substrate transporting apparatus, the receiving device is further configured to come in contact with the substrate at a plurality of portions and generate the contact sound a plurality of times when receiving the substrate.

In the above-mentioned substrate transporting apparatus, the confirmation device is further configured to confirm the delivery position of the substrate based on an average position of the receiving device when the receiving device generates the contact sound a plurality of times.

In the above-mentioned substrate transporting apparatus, the receiving device is further configured to move towards the substrate faster when confirming the delivery position of the substrate than when delivering the substrate.

In the above-mentioned substrate transporting apparatus, the receiving device is a transportation arm, and the transportation arm includes a sound collecting microphone.

In the above-mentioned substrate transporting apparatus, the transportation arm includes an adsorbing unit configured to adsorb the substrate, and the adsorbing unit is configured not to adsorb the substrate when confirming the delivery position of the substrate.

In the above-mentioned substrate transporting apparatus, the adsorbing unit includes a suction path built in the receiving device, and the sound collecting microphone is disposed inside the suction path.

In the above-mentioned substrate transporting apparatus, the substrate is a semiconductor wafer having a diameter of about 450 mm.

Further, in order to achieve the above-mentioned object, the present disclosure provides a substrate transporting apparatus including a receiving device configured to move towards a substrate accommodated in a carrier and receive the substrate; and a confirmation device configured to confirm a delivery position of the substrate based on a movement amount of the receiving device and a vibration generated when the receiving device comes in contact with the substrate.

In the above-mentioned substrate transporting apparatus, the receiving device is further configured to come in contact with the substrate at a plurality of portions and generate the vibration a plurality of times when receiving the substrate.

In the above-mentioned substrate transporting apparatus, the confirmation device is further configured to confirm the delivery position of the substrate based on an average position of the receiving device when the receiving device generates the vibration a plurality of times.

In the above-mentioned substrate transporting apparatus, the receiving device is further configured to move towards the substrate faster when confirming the delivery position of the substrate than when delivering the substrate.

In the above-mentioned substrate transporting apparatus, the receiving device is a transportation arm, and the transportation arm includes a vibration detection sensor.

In the above-mentioned substrate transporting apparatus, the transportation arm includes an adsorbing unit configured to adsorb the substrate, and the adsorbing unit is configured not to adsorb the substrate when confirming the delivery position of the substrate.

In the above-mentioned substrate transporting apparatus, the substrate is a semiconductor wafer having a diameter of about 450 mm.

Further, in order to achieve the above-mentioned object, the present disclosure provides a method for confirming a delivery position of a substrate accommodated in a carrier, including moving a receiving device receiving the substrate positioned at a predetermined position in the carrier towards the substrate; and confirming the delivery position of the substrate based on a movement amount of the receiving device and a contact sound generated when the receiving device comes in contact with the substrate.

In the above-mentioned method, in the moving step, the receiving device comes in contact with the substrate at a plurality of portions and generates the contact sound a plurality of times.

In the above-mentioned method, the confirming step further comprises confirming the delivery position of the substrate based on an average position of the receiving device when the receiving device generates the contact sound a plurality of times.

Further, in order to achieve the above-mentioned object, the present disclosure provides a method for confirming a delivery position of a substrate accommodated in a carrier, including moving a receiving device receiving the substrate positioned at a predetermined position in the carrier towards the substrate; and confirming the delivery position of the substrate based on a movement amount of the receiving device and a vibration generated when the receiving device comes in contact with the substrate.

In the above-mentioned method, in the moving step, the receiving device comes in contact with the substrate at a plurality of portions and generates the vibration a plurality of times.

In the above-mentioned method, the confirming step further comprises confirming the delivery position of the substrate based on an average position of the receiving device when the receiving device generates the vibration a plurality of times.

Further, in order to achieve the above-mentioned object, the present disclosure provides a substrate processing system which performs a predetermined processing on a substrate, including a receiving device configured to move towards a substrate accommodated in a carrier and receive the substrate; and a confirmation device configured to confirm a delivery position of the substrate based on a movement amount of the receiving device and a contact sound generated when the receiving device comes in contact with the substrate.

Further, in order to achieve the above-mentioned object, the present disclosure provides a substrate processing system which performs a predetermined processing on a substrate, including a receiving device configured to move towards a substrate accommodated in a carrier and receive the substrate; and a confirmation device configured to confirm a delivery position of the substrate based on a movement amount of the receiving device and a vibration generated when the receiving device comes in contact with the substrate.

According to the present disclosure, the delivery position of the substrate is confirmed based on a movement amount of the receiving device moving towards the substrate, and a contact sound generated when the receiving device comes in contact with the substrate. Since the receiving device comes in contact with the substrate when the receiving device reaches the delivery position of the substrate, the delivery position of the substrate may be confirmed correctly from the movement amount of the receiving device moved until the contact sound is generated.

Further, according to the present disclosure, the delivery position of the substrate is confirmed based on a movement amount of the receiving device moving towards the substrate, and a vibration generated when the receiving device comes in contact with the substrate. Since the receiving device comes in contact with the substrate when the receiving device reaches the delivery position of the substrate, the delivery position of the substrate may be confirmed correctly from the movement amount of the receiving device moved until the vibration is generated.

Further, according to the present disclosure, confirmation of the delivery position of the substrate and the delivery of the substrate are performed by the same receiving device. Therefore, the relative positional relationship between the substrate and the receiving device is not changed when confirming the delivery position of the substrate and delivering the substrate. Accordingly, even though the position of the receiving device is not adjusted correctly, the substrate may be delivered correctly by the receiving device according to the delivery position of the substrate confirmed based on the contact sound or the vibration when the receiving device comes in contact with the substrate.

Hereinafter, exemplary embodiments of the present disclosure will be described with reference to the drawings attached herewith.

Figure 1:
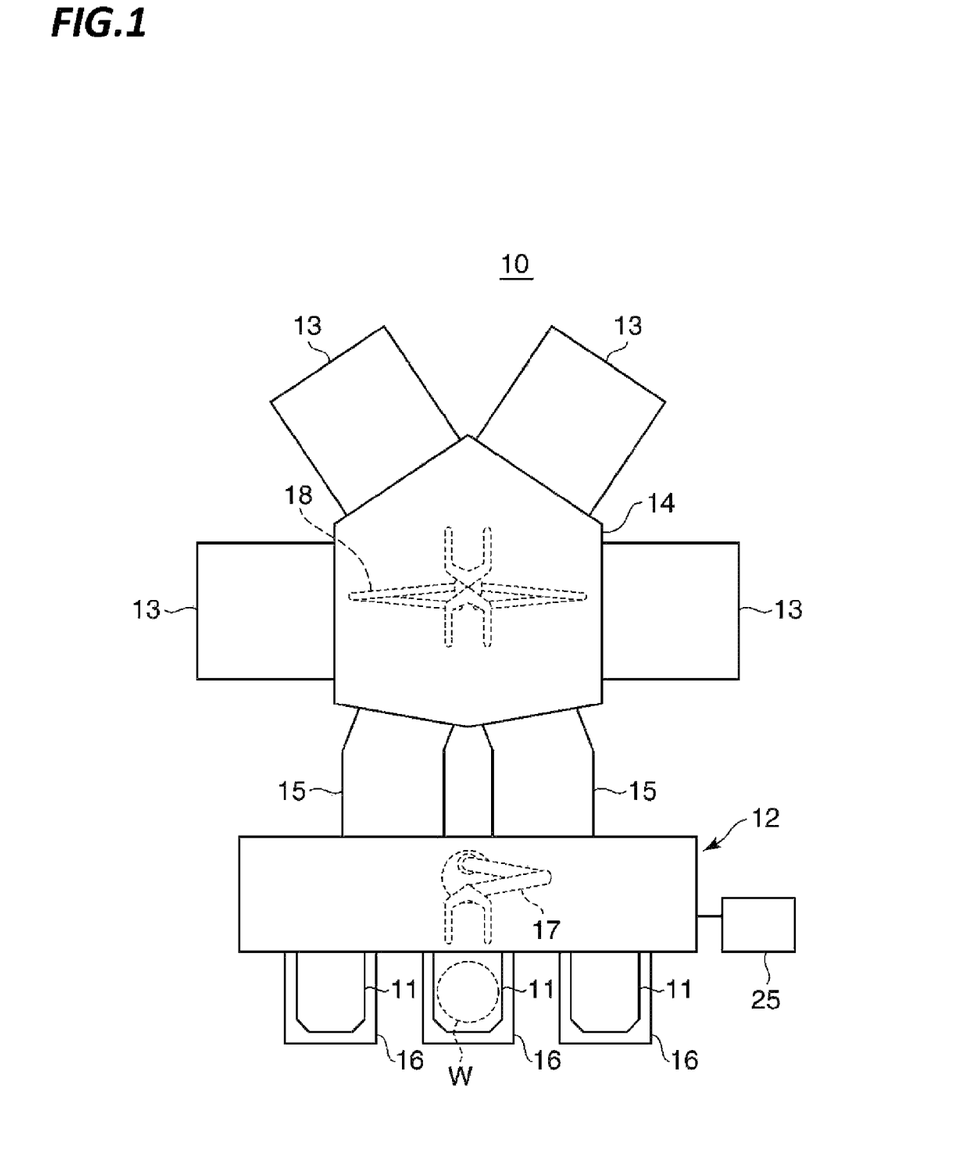
FIG. 1 is a schematic plan view illustrating a configuration of a substrate processing system according to a first exemplary embodiment of the present disclosure.

FIG. 1 is a schematic plan view illustrating a configuration of a substrate processing system according to a first exemplary embodiment of the present disclosure.

In FIG. 1, a substrate processing system 10 includes a loader module 12 (substrate transporting apparatus) configured to carry out each wafer W from a container such as a MAC 11, accommodating a plurality of wafers W (indicated by a broken line in the figure) having a diameter of, for example, 450 mm, a plurality of process modules 13 configured to perform a predetermined processing such as a dry etching processing on each of the wafer W, a transfer module 14 (substrate transporting apparatus) configured to perform carrying-in/out of each of the wafers W to/from each of the process modules 13, and two load lock modules 15 configured to perform delivery of each of the wafers W between the loader module 12 and the transfer module 14.

The loader module 12 is constituted with a substantially rectangular parallelepiped-shaped transportation chamber the inside of which is opened to the atmosphere, and is provided with a load port 16 which can be equipped with the MAC 11. Inside the transportation chamber, a transportation arm 17 (indicated by a broken line in the figure) (receiving device) is provided, which is configured to perform carrying-in/out of each of the wafers W to/from the MAC 11 equipped in the load port 16.

On the circumference of the transfer module 14, a plurality of the process modules 13 are arranged radially and connected thereto. The transfer module 14 has a transportation chamber the inside of which is decompressed, and performs transportation of each of the wafers W between each of the process modules 13 and each of the load lock modules 15 by a transportation arm 18 (indicated by a broken line in the figure) (receiving device) disposed inside the transportation chamber.

Each of the load lock modules 15 is constituted with a standby chamber the inside of which is switchable between an atmospheric pressure environment and a decompressed environment, and the delivery of each of the wafers W by the transportation arm 17 of the loader module 12 and the delivery of each of the wafers W by the transportation arm 18 of the transfer module 14 are performed through the load lock module 15.

Each of the process modules 13 has a processing chamber the inside of which is decompressed, and accommodates the wafers W one by one to perform a predetermined processing on the wafers W by a plasma generated in the processing chamber.

The loader module 12 is provided with three load ports 16 disposed at a side opposite to the side connected with each of the load lock modules 15. Each of the load ports 16 allows the inside of the MAC 11 and the inside of the loader module 12 to communicate with each other by removing a cover from the MAC 11 which has been equipped therein.

Further, the substrate processing system 10 includes a control unit 25 (confirmation device). The control unit 25 controls operation of each component of the substrate processing system 10 in accordance with a program which realizes a predetermined recipe to perform a processing corresponding to the predetermined recipe on each of the wafer W. Further, although the control unit 25 is connected to the loader module 12 in FIG. 1, the control unit 25 may be connected to any one of components in the substrate processing system 10, or any one of the components may have the control unit 25. Further, the control unit 25 may be configured as an external server installed in a place different from the substrate processing system 10.

Figure 2:
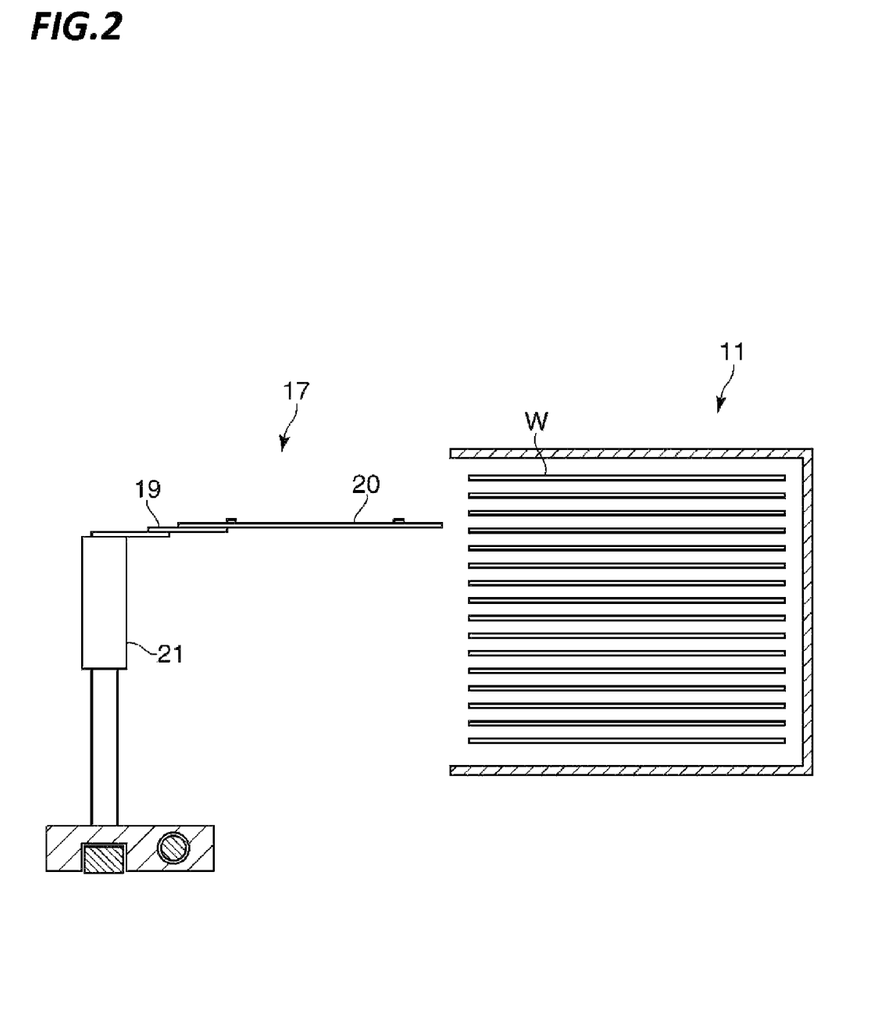
FIG. 2 is a cross-sectional view illustrating a positional relationship between a transportation arm and an MAC in a loader module of FIG. 1.

FIG. 2 is a cross-sectional view illustrating a positional relationship between the transportation arm and the MAC in the loader module of FIG. 1. In FIG. 2, the transportation chamber of the loader module 12 is omitted, and a state where the inside of the MAC 11 is communicated with the inside of the loader module 12 by removing the cover from the MAC 11, is illustrated.

In FIG. 2, the transportation arm 17 is provided with an expandable/retractable arm portion 19, and a bifurcated plate-shaped end effector 20 (receiving device), which is made of silicon carbide (SiC) or ceramics, installed at the tip of the arm portion 19, and is installed in a base 21 which can rotate and move up and down, and which can move along the longitudinal direction of the loader module 12.

In the transportation arm 17, the end effector 20 is disposed substantially in parallel with each of the wafers W that is accommodated horizontally in the MAC 11, and is formed in a thickness capable of entering into a gap between the wafers W.

When the wafer W is taken out from the inside of the MAC 11, the end effector 20 enters into the gap between the wafers W in the MAC 11 by co-operation of the arm portion 19 and the base 21 after the transportation arm 17 faces the MAC 11, moves up by a predetermined amount to load the wafer W, and then, retreats together with the wafer W from the inside of the MAC 11.

Figure 3A:
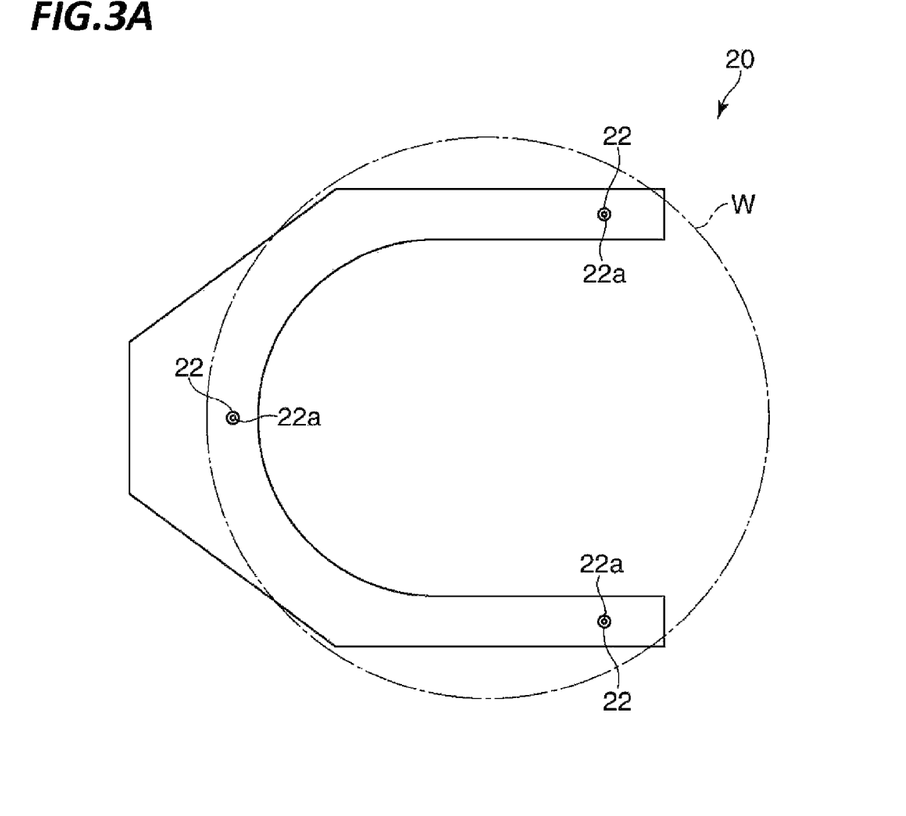
FIGS. 3A and 3B are a plan view and a side view, respectively, schematically illustrating a configuration of an end effector of FIG. 2.
Figure 3B:
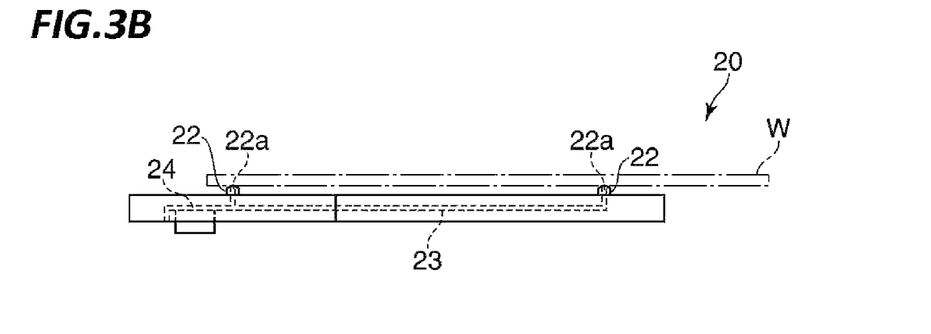

FIGS. 3A and 3B are a plan view and a side view, respectively, schematically illustrating a configuration of the end effector of FIG. 2.

In FIGS. 3A and 3B, the end effector 20 has, for example, three protruded pads 22 on its upper surface. Each of the pads 22 is made of, for example, plastics or ceramics, and is disposed on the concentric circumference of the wafer W (indicated by a single-dot line in the figure) which is loaded on the end effector 20. In addition, the number of the pads 22 is not limited to three, but may be four or more as long as the wafer W is supported stably.

When the end effector 20 loads the wafer W thereon, each of the pads 22 supports the rear surface of the wafer W directly. However, since the circumference on which each of the pads 22 is disposed is relatively closer to the center of the wafer W than its outer periphery, the wafer W is supported relatively near the center by each of the pads 22.

Each of the pads 22 is formed with an opening 22a on its upper side. The opening 22a is communicated with a suction line 23 (indicated by a broken line in the figure) (adsorbing unit, suction path) provided in the end effector 20. The suction line 23 is connected to an exhaust pump (not illustrated) through the arm portion 19 or the base 21, and adsorbs the wafer W through the opening 22a by operating the exhaust pump. As a result, for example, when taking out the wafer W from the inside of the MAC 11 after the end effector 20 loads the wafer W, the wafer W is suppressed from being moved relatively with respect to the end effector 20. Further, a sound collecting microphone 24 is disposed in the suction line 23 of the end effector 20.

When taking out the wafer W from the inside of the MAC 11, the end effector 20 which has entered into the gap between the wafers W moves up and lifts a wafer W above the end effector 20 to receive the wafer W. Accordingly, it is required to confirm the delivery position of the wafer W, which is a contact position between each of the pads 22 and the rear surface of the wafer W when the end effector 20 moves up, in advance, and control the movement of the end effector 20 based on the delivery position.

In the present exemplary embodiment, in response to this, the delivery position of each of the wafers W is confirmed by using the end effector 20 and each of the wafers W before taking out the wafers W from the inside of the MAC 11.

Figure 4A:
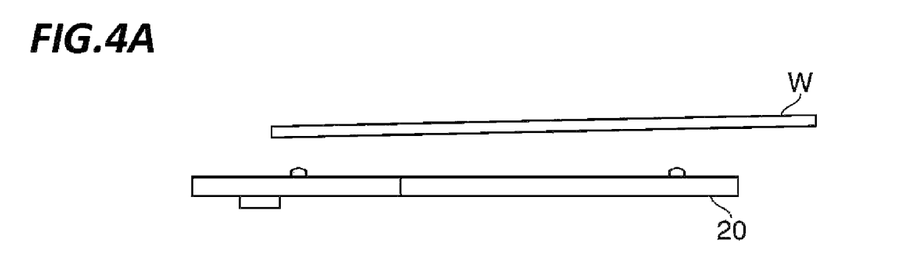
FIGS. 4A to 4C are views illustrating a method for confirming a wafer delivery position as a method for confirming a substrate delivery position according to the present exemplary embodiment.
Figure 4B:
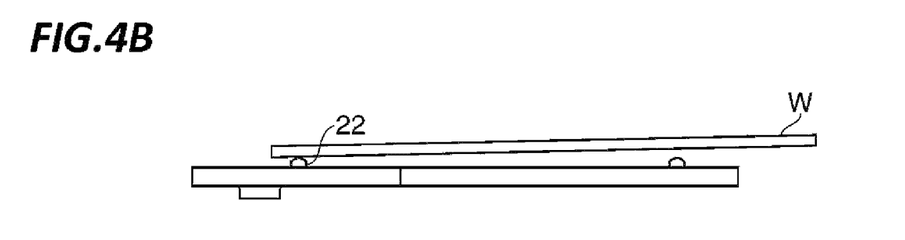
Figure 4C:
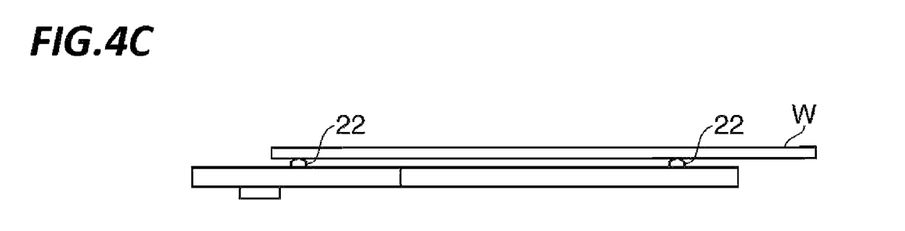

FIGS. 4A to 4C are views illustrating a method for confirming a wafer delivery position as a method for confirming a substrate delivery position according to the present exemplary embodiment. The method of the present disclosure is performed by the control unit 25 controlling operations of each component, mainly the transportation arm 17 before taking out each of the wafer W from the inside of the MAC 11 by the transportation arm 17.

First, the end effector 20 is allowed to enter into a gap between two vertically neighboring wafers W inside the MAC 11, and is positioned just below a wafer W to be taken out (hereinafter, referred to as a "target wafer W") which is positioned at the upper side (FIG. 4A).

Subsequently, the end effector 20 is moved up towards the target wafer W. When the pads 22 come in contact with the rear surface of the target wafer W, a contact sound is generated. The sound collecting microphone 24 in the suction line 23 collects the contact sound (FIG. 4B). At this time, if the target wafer W is inclined, each of the pads 22 does not come in contact with the rear surface of the target wafer W at the same time, but at a different timing. And, the control unit 25 allows the end effector 20 to continuously move up even after the first contact sound is generated.

Subsequently, the control unit 25 stops the end effector 20 moving up after the sound collecting microphone 24 collects the contact sound as many times as the number of the pads 22. If the target wafer W is inclined, the contact sound is generated as many times as the number of the pads 22 until all the pads 22 come in contact with the rear surface of the target wafer W. Accordingly, when the end effector 20 is stopped moving up after the contact sound is collected as many times as the number of the pads 22, all the pads 22 come in contact with the target wafer W (FIG. 4C).

Subsequently, the control unit 25 confirms the delivery position of the wafer W based on the upward movement amount of the end effector 20 and each of the generation timing of the contact sound. For example, the middle of the height of the end effector 20 at the generation timing of the first collected contact sound and the height of the end effector 20 at the generation timing of the last collected contact sound is confirmed as a delivery position of the wafer W. Or, the average height of the end effector 20 in each of the generation timing of the contact sound (three times in the end effector 20 of FIG. 3) is confirmed as a delivery position.

Subsequently, the control unit 25 stores the confirmed delivery position of the wafer W in, for example, a built-in memory, and terminates the present method.

According to the method for confirming a wafer delivery position of FIG. 4, the delivery position of the wafer W is confirmed based on the upward movement amount of the end effector 20 moving up towards the target wafer W, and the contact sound generated when the end effector 20 comes in contact with the target wafer W. Since the end effector 20 comes in contact with the target wafer W when the end effector 20 reaches the delivery position of the wafer W, the delivery position of the wafer W may be confirmed correctly from the upward movement amount of the end effector 20 moved up until the contact sound is generated.

Accordingly, after the delivery position of the wafer W is confirmed by the transportation arm 17, it is possible to eliminate the need for a visual confirmation of the delivery position of the wafer W again for safety. In addition, since the end effector 20 comes in contact with each of the wafers W correctly based on the confirmed delivery position of the wafer W, it is possible to eliminate unnecessary movement of the end effector 20. Further, since it is possible to know the contact position of the end effector 20 and each of the wafers W correctly, the moving speed of the end effector 20 may be increased immediately before the time of contacting with each of the wafers W, and then, may be decreased to the extent that each of the wafers W does not float at the time of the contact, thereby improving the throughput.

Further, since the contact sound between the end effector 20 and the target wafer W is collected, the control unit 25 may analyze the contact sound. Accordingly, the control unit 25 may detect any crack or chipping occurring in the end effector 20 or the arm portion 19, for example, in a case where the frequency distribution of the contact sound is unusual.

Further, since the confirmation of the delivery position of the wafer W and the subsequent delivery of the wafer W are performed by the same transportation arm 17, the relative positional relationship between the wafer W and the end effector 20 is not changed at the time of confirming the delivery position of the wafer W and at the time of delivering the wafer W. Accordingly, even though the position of each component of the transportation 17, for example, the position of the end effector 20 is not adjusted correctly, the wafer W may be delivered correctly by the transportation arm 17 based on the confirmed delivery position of the wafer W.

In the method for confirming a wafer delivery position of FIGS. 4A to 4C as described above, if the target wafer W is inclined, the contact sound is generated a plurality of times when the end effector 20 comes in contact with the target wafer W, and thus, the detection of the contact sound is suppressed from being omitted.

Further, in the method for confirming a wafer delivery position of FIGS. 4A to 4C as described above, the delivery position of the wafer W is confirmed based on the average height of the end effector 20 at the generation timing of the contact sound generated a plurality of times. Accordingly, even if a false detection of the contact sound occurs, the affection of false detection may be relieved, and thus, the delivery position of the wafer W may be confirmed more correctly.

Further, in the above-mentioned transportation arm 17, the sound collecting microphone 24 is disposed in the suction line 23 built in the end effector 20. The contact sound generated when the end effector 20 comes in contact with the target wafer W is introduced into the suction line 23 through the openings 22a of each of the pads 22, and is amplified by repeating reflection in the suction line 23, thereby confirming the contact sound securely.

In the method for confirming a wafer delivery position of FIGS. 4A to 4C as described above, the end effector 20 may move up towards the wafer W faster when confirming the delivery position of the wafer W than when delivering the wafer W. As a result, the contact sound between the end effector 20 and the target wafer W may be larger, and thus, the delivery position of the wafer W may be confirmed more correctly.

Further, in the method for confirming a wafer delivery position of FIGS. 4A to 4C as described above, it is desirable that the suction line 23 does not adsorb the wafer W when confirming the delivery position of the wafer W. As a result, the wafer W may be suppressed from being adsorbed and deformed immediately before the end effector 20 comes in contact with the target wafer W, thereby generating the contact sound at the delivery position correctly.

Further, the sound collecting microphone 24 may not be disposed in the suction line 23, but may be installed, for example, on the surface, particularly the upper surface of the end effect 20, or in the MAC 11.

Next, description will be made on a substrate transporting apparatus and a method for confirming a substrate delivery position according to a second exemplary embodiment of the present disclosure.

This exemplary embodiment has basically the same configuration or operation as those described in the first exemplary embodiment, except that a vibration detection sensor is provided instead of the sound collecting microphone. Accordingly, description for redundant configuration and operation will be omitted, but description for different configuration and operation will be made below.

Figure 5:
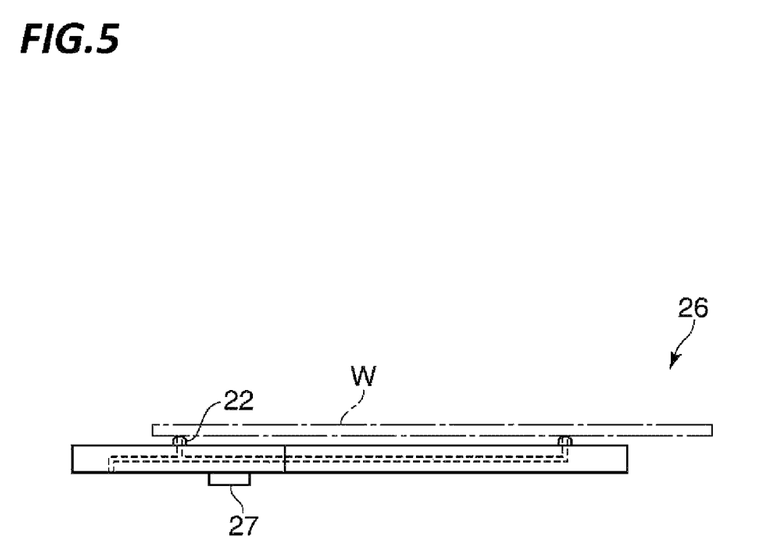
FIG. 5 is a schematic side view illustrating a configuration of an end effector of a transportation arm in a loader module as a substrate transporting apparatus according to a second exemplary embodiment of the present disclosure.

FIG. 5 is a schematic side view illustrating a configuration of an end effector of a transportation arm in a loader module as a substrate transporting apparatus according to the present exemplary embodiment.

In FIG. 5, an end effector 26 is provided with a vibration detection sensor 27 disposed on the lower surface, instead of the sound collecting microphone 24, and detects a vibration generated when each pad 22 comes in contact with the wafer W by moving up the end effector 26.

In a method for confirming a wafer delivery position as the method for confirming a substrate delivery position according to the present exemplary embodiment, as in the method for confirming a wafer delivery position in FIGS. 4A to 4C, first, the end effector 26 is allowed to enter into a gap between two vertically neighboring wafers W inside the MAC 11, and is positioned just below the target wafer W which is positioned at the upper side. Then, the end effector 26 is moved up towards the target wafer W. When the pads 22 come in contact with the rear surface of the target wafer W, a vibration is generated. The vibration detection sensor 27 detects the vibration. If the wafer W is inclined, the vibration is generated as many times as the number of the pads 22.

Subsequently, the control unit 25 stops the end effector 26 moving up after the vibration detection sensor 27 detects the vibration as many times as the number of the pads 22, and confirms the delivery position of the wafer W based on the upward movement amount of the end effector 26 and each of the generation timing of the vibration. For example, the middle of the height of the end effector 26 at the generation timing of the first detected vibration and the height of the end effector 26 at the generation timing of the last detected vibration is confirmed as a delivery position of the wafer W. Or, the average height of the end effector 26 in each of the generation timing of the vibration is confirmed as a delivery position.

Subsequently, the control unit 25 stores the confirmed delivery position of the wafer W in, for example, a built-in memory, and terminates the present method.

According to the method for confirming a wafer delivery position of the present exemplary embodiment, the delivery position of the wafer W is confirmed based on the upward movement amount of the end effector 26 moving up towards the target wafer W, and the vibration generated when the end effector 26 comes in contact with the target wafer W. Since the end effector 26 comes in contact with the target wafer W when the end effector 26 reaches the delivery position of the wafer W, the delivery position of the wafer W may be confirmed correctly from the upward movement amount of the end effector 26 moved up until the vibration is generated.

Accordingly, as in the first exemplary embodiment, it is possible to eliminate the need for a visual confirmation of the delivery position of the wafer W again. In addition, it is possible to eliminate unnecessary movement of the end effector 26, thereby improving the throughput.

Further, since a down-flow usually occurs in the loader module 12 to generate a flow noise, it may be difficult to detect the contact sound when the end effector 26 comes in contact with the wafer W. However, in the method for confirming a substrate delivery position according to the present exemplary embodiment, since the vibration of the end effector 26 and the target wafer W is detected, even though the flow noise is large, the delivery position of the wafer W may be confirmed. In addition, the control unit 25 may analyze the vibration. Accordingly, the control unit 25 may detect any crack or chipping occurring in the end effector 26 or the arm portion 19.

Further, even in the method for confirming a wafer delivery position of the present exemplary embodiment, if the target wafer W is inclined, the vibration is generated a plurality of times when the end effector 26 comes in contact with the wafer W, and thus, the detection of the vibration is suppressed from being omitted. Further, the delivery position of the wafer W is confirmed based on the average height of the end effector 26 at the generation timing of the vibration generated a plurality of times. Accordingly, the affection of false detection may be relieved, and thus, the delivery position of the wafer W may be confirmed more correctly.

Further, as in the first exemplary embodiment, the end effector 26 may be moved up towards the wafer W faster when confirming the delivery position of the wafer W than when delivering the wafer W. Further, the suction line 23 may not adsorb the wafer W when confirming the delivery position of the wafer W.

Next, description will be made on a method for confirming a substrate delivery position according to a third exemplary embodiment of the present disclosure.

Figure 6:
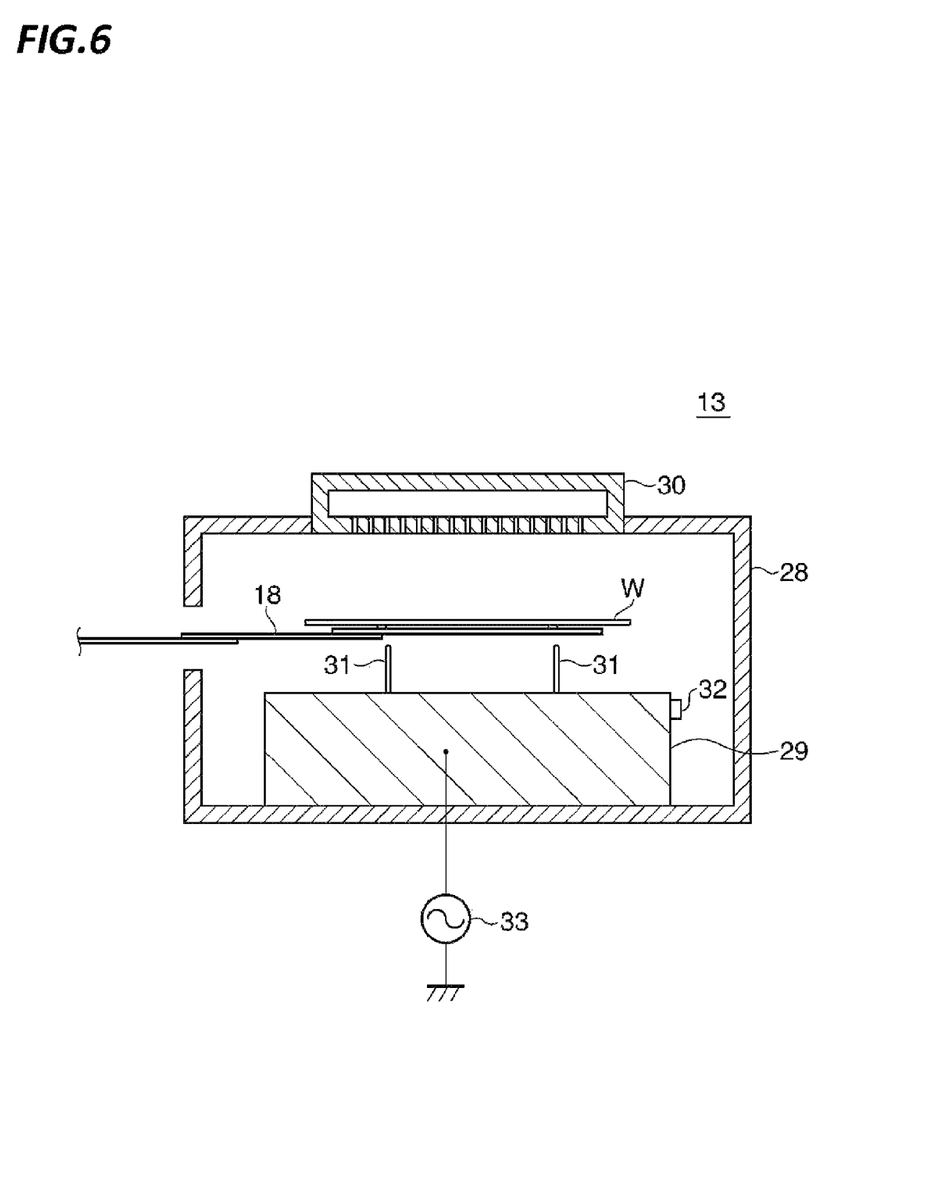
FIG. 6 is a view for describing a positional relationship between the transportation arm and the process module in FIG. 1 when performing the method for confirming a substrate delivery position according to a third exemplary embodiment of the present disclosure.

FIG. 6 is a view for describing a positional relationship between the transportation arm and the process module in FIG. 1 when performing the method for confirming a substrate delivery position according to the present exemplary embodiment.

In FIG. 6, the process module 13 includes a susceptor 29 as a mounting table disposed at the lower side in a processing chamber 28, and a shower head 30 disposed so as to face the susceptor 29 in the processing chamber 28.

The inside of the processing chamber 28 is decompressed. A high-frequency power source 33 is connected to the susceptor 29. A processing gas supply apparatus (not illustrated) is connected to the shower head 30. When performing a predetermined processing such as a plasma processing on the wafer W, the shower head 30 introduces a processing gas into the processing chamber 28, and the susceptor 29 applies a high-frequency voltage into the processing chamber 28. As a result, plasma is generated in the processing chamber 28.

Figure 7:
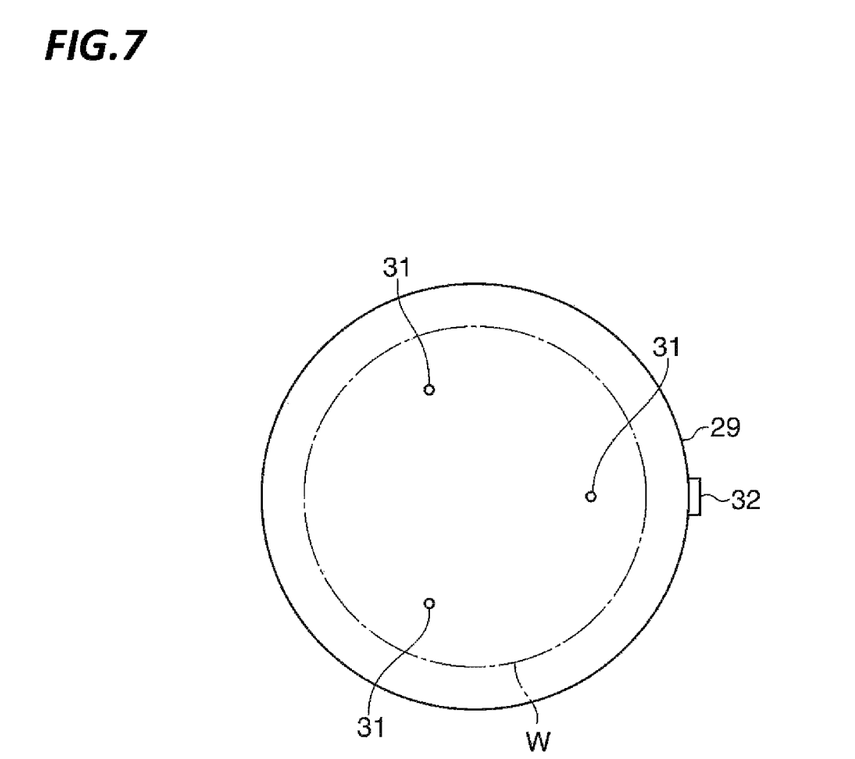
FIG. 7 is a plan view illustrating an arrangement state of each lift pin of a susceptor in FIG. 6.

The susceptor 29 has a cylindrical shape, and includes a plurality of (for example, three) lift pins 31 (receiving device) capable of protruding on the upper surface. As illustrated in FIG. 7, each of the lift pins 31 is usually built in the susceptor 29, and is disposed on the concentric circumference of the wafer W (indicated by a single-dot line in the figure) which is loaded by the susceptor 29. In addition, the number of the lift pins 31 is not limited to three, but may be four or more as long as the wafer W is supported stably. Further, the susceptor 29 includes a vibration detection sensor 32 disposed at the lateral surface.

In the process module 13, the transportation arm 18 enters into the processing chamber 28, and performs carrying-in/out of the wafer W to/from the processing chamber 28 in co-operation with each of the lift pins 31.

For example, in a case where the wafer W is carried into the processing chamber 28, when the transportation arm 18 loading the wafer W is allowed to face the wafer W with the susceptor 29, each of the lift pins 31 protrudes from the susceptor 29 and comes in contact with the rear surface of the wafer W to lift the wafer W slightly from the transportation arm 18. Thereafter, the transportation arm 18 retreats from the processing chamber 28, and each of the lift pins 31 moves down to load the wafer W on the upper surface of the susceptor 29.

Further, in a case where the wafer W is carried out from the processing chamber 28, each of the lift pins 31 protrudes from the susceptor 29 to lift the wafer W, and the transportation arm 18 which has entered into the processing chamber 28 is positioned just below the lifted wafer W. Thereafter, each of the lift pins 31 moves down to deliver the wafer W to the transportation arm 18, and the transportation arm 18 retreats from the processing chamber 28.

In the susceptor 29, since the circumference on which the lift pins 31 are disposed is relatively closer to the center of the wafer W than its outer periphery, the wafer W is supported relatively near the center by each of the lift pins 31.

In the process module 13, when performing carrying in/out of the wafer W to/from the processing chamber 28, since each of the lift pins 31 moves up and down with respect to the transportation arm 18 to perform the delivery of the wafers W, as described above, it is required to confirm the delivery position of the wafer W, which is a contact position of the rear surface of the wafer W loaded on the transportation arm 18 and each of the lift pins 31, and control the upward movement of each of the lift pins 31 based on the delivery position.

In the present exemplary embodiment, in response to this, the delivery position of the wafer W in each of the process modules 13 is confirmed by using each of the lift pins 31 and the wafer W before performing carrying-in/out the wafers W to/from the processing chamber 28.

Figure 8A:
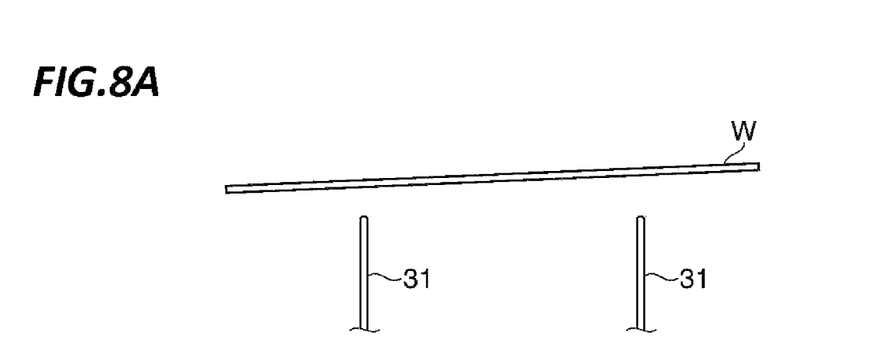
FIGS. 8A to 8C are views illustrating a method for confirming a wafer delivery position as a method for confirming a substrate delivery position according to the exemplary embodiment of the present disclosure.
Figure 8B:
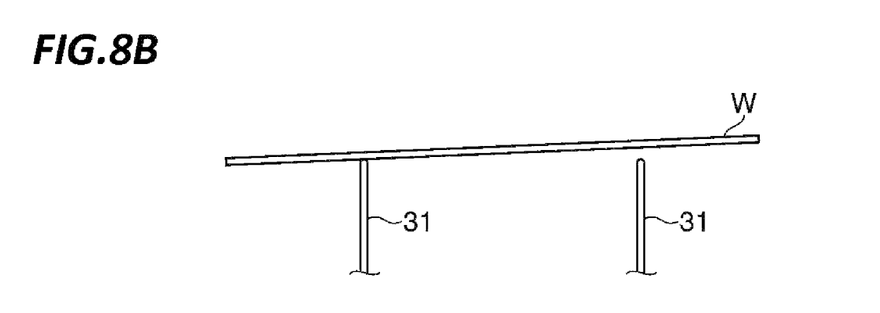
Figure 8C:
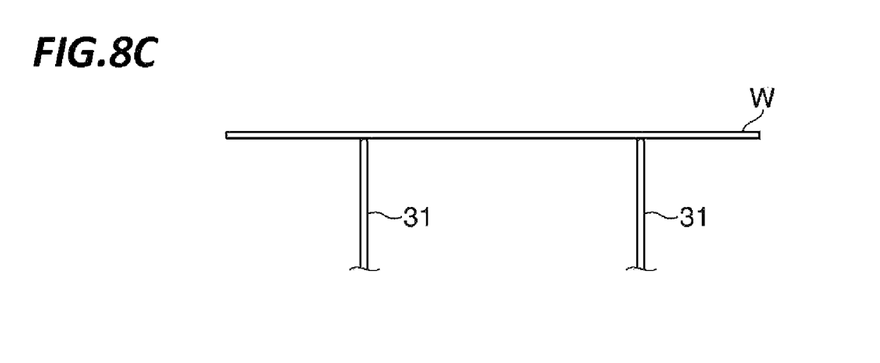

FIGS. 8A to 8C are views illustrating a method for confirming a wafer delivery position as a method for confirming a substrate delivery position according to the present exemplary embodiment. The method of the present disclosure is performed by the control unit 25 controlling operations of each of the lift pins 31 and the transportation arm 18 before performing carrying-in/out the wafer W to/from the processing chamber 28. Furthermore, for the purpose of the convenience of the explanation, the transportation arm 18 is omitted in FIGS. 8A to 8C.

First, the transportation arm 18 loading the wafer W is allowed to enter into the processing chamber 28, and is positioned just above the susceptor 29 (FIG. 8A).

Subsequently, each of the lift pins 31 is allowed to protrude towards the target wafer W. When the lift pins 31 come in contact with the rear surface of the target wafer W, a vibration is generated. The vibration detection sensor 32 of the susceptor 29 detects the vibration (FIG. 8B). At this time, if the target wafer W is inclined, each of the lift pins 31 does not come in contact with the rear surface of the target wafer W at the same time, but at a different timing. And, the control unit 25 allows each of the lift pins 31 to continuously protrude even after the first vibration is generated.

Subsequently, the control unit 25 stops the lift pins 31 protruding after the vibration detection sensor 32 detects the vibration as many times as the number of the lift pins 31. If the target wafer W is inclined, the vibration is generated as many times as the number of the lift pins 31 until all the lift pins 31 come in contact with the rear surface of the target wafer W. Accordingly, when the lift pins 31 are stopped protruding after the vibration is detected as many times as the number of the lift pins 31, all the lift pins 31 come in contact with the target wafer W (FIG. 8C).

Subsequently, the control unit 25 confirms the delivery position of the wafer W based on the protrusion amount of the lift pins 31 and each of the generation timing of the vibration. For example, the middle of the protrusion amount of the lift pins 31 at the generation timing of the first detected vibration and the protrusion amount of the lift pins 31 at the generation timing of the last detected vibration is confirmed as a delivery position of the wafer W. Or, the average protrusion amount of the lift pins 31 in each of the generation timing of the vibration (three times with the lift pins 31 of FIGS. 6 and 7) is confirmed as a delivery position.

Subsequently, the control unit 25 stores the confirmed delivery position of the wafer W in, for example, a built-in memory, and terminates the present method.

According to the method for confirming a wafer delivery position of FIGS. 8A to 8C, the delivery position of the wafer W is confirmed based on the protrusion amount of the lift pins 31 protruding towards the target wafer W, and the vibration generated when the lift pins 31 come in contact with the target wafer W. Since the lift pins 31 come in contact with the target wafer W when the lift pins 31 reach the delivery position of the wafer W, the delivery position of the wafer W may be confirmed correctly from the protrusion amount of the lift pins 31 until the vibration is generated.

Accordingly, since the lift pins 31 come in contact with each of the wafers W correctly based on the confirmed delivery position of the wafer W, it is possible to eliminate unnecessary protrusion of the lift pins 31. Further, since it is possible to know the contact position of the lift pins 31 and each of the wafers W correctly, the protruding speed of the lift pins 31 may be increased immediately before the time of contacting with each of the wafers W, and then, may be decreased to the extent that each of the wafers W does not float at the time of the contact, thereby improving the throughput.

Further, since the vibration is detected when the lift pins 31 come in contact with the target wafer W, the delivery position of the wafer W may be confirmed even in the inside of the processing chamber 28 where the contact sound is hardly delivered. Further, the control unit 25 may analyze the vibration, and thus, detect any crack or chipping occurring in the lift pins 31.

Further, since the confirmation of the delivery position of the wafer W and the subsequent delivery of the wafer W are performed by the same lift pins 31, the relative positional relationship between the wafer W and the lift pins 31 is not changed at the time of confirming the delivery position of the wafer W and at the time of delivering the wafer W. Accordingly, even though the positions of the lift pins 31 are not adjusted correctly, the wafer W may be delivered correctly by the lift pins 31 based on the confirmed delivery position of the wafer W.

In the method for confirming a wafer delivery position of FIGS. 8A to 8C as described above, if the target wafer W is inclined, the vibration is generated a plurality of times when the lift pins 31 come in contact with the target wafer W, and thus, the detection of the vibration is suppressed from being omitted.

Further, in the method for confirming a wafer delivery position of FIGS. 8A to 8C as described above, the delivery position of the wafer W is confirmed based on the average protrusion amount of the lift pins 31 at the generation timing of the vibration generated a plurality of times. Accordingly, even if a false detection of the vibration occurs, the affection of false detection may be relieved, and thus, the delivery position of the wafer W may be confirmed more correctly.

In the method for confirming a wafer delivery position of FIGS. 8A to 8C as described above, it is desirable that the lift pins 31 are protruded towards the wafer W faster when confirming the delivery position of the wafer W than when delivering the wafer W. As a result, the vibration when the lift pins 31 come in contact with the target wafer W may be larger, and thus, the delivery position of the wafer W may be confirmed more correctly.

Further, the vibration detection sensor 32 may not be disposed in the susceptor 29 in the processing chamber 28, but may be disposed, for example, in the transportation arm 18.

In the method for confirming a wafer delivery position of FIGS. 8A to 8C as described above, since the processing chamber 28 is decompressed, the delivery position of the wafer W is confirmed based on the vibration generated when the lift pins 31 come in contact with the target wafer W. However, in a case where the processing chamber 28 is not decompressed but is maintained, for example, under the atmospheric pressure, the delivery position of the wafer W may be confirmed based on the contact sound generated when the lift pins 31 come in contact with the target wafer W. In this case, a sound collecting microphone may be disposed in the processing chamber 28 instead of the vibration detection sensor 32.

As described above, the present disclosure has been described with reference to the exemplary embodiments, but the present disclosure is not limited to the exemplary embodiments.

For example, in the first and second exemplary embodiments, the delivery position of the wafer W in the MAC 11 is confirmed. However, the present disclosure may be adopted to confirm a delivery position of the wafer W in a front opening unified pod (FOUP) or a front opening shipping box (FOSB).

Further, the object of the present disclosure may also be achieved by supplying a storage medium storing a program code of software which realizes the functions of the respective exemplary embodiments as described above, to a computer, for example, the control unit 25, and reading and executing the program code stored in the storage medium by a CPU of the control unit 25.

In this case, the program code itself which is read from the storage medium realizes the functions of the respective exemplary embodiments, and the program code and the storage medium storing the program code constitute the present disclosure.

Further, the storage medium for supplying the program code may be any storage medium capable of storing the program code, such as, for example, RAM, NVRAM, a floppy disc (registered trade mark), a hard disk, a magneto-optical disc, an optical disc such as CD-ROM, CD-R, CD-RW and DVD (DVD-ROM, DVD-RAM, DVD-RW and DVD+RW), a magnetic tape, a non-volatile memory card or other ROM. Or, the program code may be supplied to the control unit 25 by downloading it from other computers or databases (not illustrated) connected to the control unit 25 via the internet, a commercial network or a local area network.

Further, the present disclosure includes a case where the functions of the respective exemplary embodiments are realized by implementing the program code read by the control unit 25, as well as a case where an operating system (OS) operating on a CPU performs a part or all of the actual processing based on instructions of the program code, and thus, the functions of the respective exemplary embodiments are realized by the processing.

Further, the present disclosure includes a case where the program code read from the storage medium is stored in a memory provided in a function expanding board built in the control unit 25 or a function expanding unit connected to the control unit 25, and then, a CPU provided in the function expanding board or the function expanding unit performs a part or all of the actual processing based on instructions of the program code, and thus, the functions of the respective exemplary embodiments are realized by the processing.

The program code may be made in a form of an object code, a program code executed by an interpreter or a script data supplied to an OS.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A substrate transporting apparatus comprising:
a receiving device configured to move towards a substrate accommodated in a carrier to receive the substrate and come in contact with the substrate at a plurality of portions thereof in order to generate a contact sound when receiving the substrate; and
a confirmation device configured to obtain a height of the receiving device when the receiving device generates the contact sound at least once and confirm a delivery position of the substrate based on an average height of the receiving device.

2. The substrate transporting apparatus of claim 1, wherein the receiving device is further configured to move towards the substrate faster when confirming the delivery position of the substrate than when delivering the substrate.

3. The substrate transporting apparatus of claim 1, wherein the receiving device is a transportation arm, and the transportation arm includes a sound collecting microphone.

4. The substrate transporting apparatus of claim 3, wherein the transportation arm includes an adsorbing unit configured to adsorb the substrate, and the adsorbing unit is configured not to adsorb the substrate when confirming the delivery position of the substrate.

5. The substrate transporting apparatus of claim 4, wherein the adsorbing unit includes a suction path built in the receiving device, and the sound collecting microphone is disposed inside the suction path.

6. The substrate transporting apparatus of claim 1, wherein the substrate is a semiconductor wafer having a diameter of about 450 mm.

7. A substrate transporting apparatus comprising:
a receiving device configured to move towards a substrate accommodated in a carrier to receive the substrate and come in contact with the substrate at a plurality of portions thereof in order to generate a vibration when receiving the substrate; and
a confirmation device configured to obtain a height of the receiving device when the receiving device generates the vibration at least once and confirm a delivery position of the substrate based on an average height of the receiving device.

8. The substrate transporting apparatus of claim 7, wherein the receiving device is further configured to move towards the substrate faster when confirming the delivery position of the substrate than when delivering the substrate.

9. The substrate transporting apparatus of claim 7, wherein the receiving device is a transportation arm, and the transportation arm includes a vibration detection sensor.

10. The substrate transporting apparatus of claim 9, wherein the transportation arm includes an adsorbing unit configured to adsorb the substrate, and the adsorbing unit is configured not to adsorb the substrate when confirming the delivery position of the substrate.

11. The substrate transporting apparatus of claim 7, wherein the substrate is a semiconductor wafer having a diameter of about 450 mm.

12. A method for confirming a delivery position of a substrate accommodated in a carrier, the method comprising:
moving a receiving device receiving the substrate positioned at a predetermined position in the carrier towards the substrate and contacting the substrate by the receiving device at a plurality of portions thereof thereby generating a contact sound;
obtaining a height of the receiving device when the receiving device generates the contact sound at least once; and
confirming the delivery position of the substrate based on an average height of the receiving device.

13. A method for confirming a delivery position of a substrate accommodated in a carrier, the method comprising:
moving a receiving device receiving the substrate positioned at a predetermined position in the carrier towards the substrate and contacting the substrate by the receiving device at a plurality of portions thereof thereby a vibration;
obtaining a height of the receiving device when the receiving device generates the vibration at least once; and
confirming the delivery position of the substrate based on an average hei ht of the receiving device.

14. A substrate processing system which performs a predetermined processing on a substrate, comprising:
a receiving device configured to move towards a substrate accommodated in a carrier to receive the substrate and come in contact with the substrate at a plurality of portions thereof in order to generate a contact sound when receiving the substrate; and
a confirmation device configured to obtain a height of the receiving device when the receiving device generates the contact sound at least once and confirm a delivery position of the substrate based on an average height of the receiving device.

15. A substrate processing system which performs a predetermined processing on a substrate, comprising:
a receiving device configured to move towards a substrate accommodated in a carrier to receive the substrate and come in contact with the substrate at a plurality of portions thereof in order to generate a vibration when receiving the substrate; and
a confirmation device configured to obtain a height of the receiving device when the receiving device generates the vibration at least once and confirm a delivery position of the substrate based on an average height of the receiving device.

* * * * *